(12) United States Patent
Qiao et al.

(10) Patent No.: US 11,451,009 B2
(45) Date of Patent: Sep. 20, 2022

(54) VERTICAL CAVITY SURFACE EMITTING LASER MODE CONTROL

(71) Applicant: Lumentum Operations LLC, San Jose, CA (US)

(72) Inventors: Pengfei Qiao, Albany, CA (US); Chien-Yao Lu, Fremont, CA (US); Albert Yuen, Palo Alto, CA (US)

(73) Assignee: Lumentum Operations LLC, San Jose, CA (US)

( * ) Notice: Subject to any disclaimer, the term of this patent is extended or adjusted under 35 U.S.C. 154(b) by 124 days.

(21) Appl. No.: 16/725,400

(22) Filed: Dec. 23, 2019

(65) Prior Publication Data

US 2020/0335943 A1 Oct. 22, 2020

Related U.S. Application Data

(60) Provisional application No. 62/835,787, filed on Apr. 18, 2019.

(51) Int. Cl.
| | |
|---|---|
| *H01S 5/183* | (2006.01) |
| *H01S 5/042* | (2006.01) |
| *H01S 5/20* | (2006.01) |
| *H01S 5/065* | (2006.01) |

(52) U.S. Cl.
CPC ...... *H01S 5/18322* (2013.01); *H01S 5/04254* (2019.08); *H01S 5/0653* (2013.01); *H01S 5/1833* (2013.01); *H01S 5/18311* (2013.01); *H01S 5/18386* (2013.01); *H01S 5/18394* (2013.01); *H01S 5/2063* (2013.01); *H01S 2301/16* (2013.01); *H01S 2301/18* (2013.01)

(58) Field of Classification Search
CPC ..... H01S 5/183–18397; H01S 2301/18; H01S 2301/20–206; H01S 5/18386; H01S 5/18391; H01S 5/18394
See application file for complete search history.

(56) References Cited

U.S. PATENT DOCUMENTS

| | | | | |
|---|---|---|---|---|
| 6,356,573 | B1 * | 3/2002 | Jonsson | H01S 5/18355 372/46.01 |
| 2004/0105476 | A1 * | 6/2004 | Wasserbauer | H01S 5/141 372/50.22 |
| 2004/0165636 | A1 * | 8/2004 | Ezaki | H01S 5/18313 372/46.013 |
| 2010/0103969 | A1 * | 4/2010 | Aalto | H01S 5/18394 372/45.01 |
| 2013/0188659 | A1 * | 7/2013 | Kondo | B82Y 20/00 372/24 |

(Continued)

OTHER PUBLICATIONS

Co-pending U.S. Appl. No. 16/202,510, entitled Emitter Array That Includes Inhomogeneous Emitter Distribution to Flatten a Beam Profile of the Emitter Array, by Xiaohua Lou, filed Nov. 28, 2018, 47 pages.

(Continued)

*Primary Examiner* — Sean P Hagan
(74) *Attorney, Agent, or Firm* — Harrity & Harrity, LLP (57) ABSTRACT

A vertical cavity surface emitting laser (VCSEL) may include a top contact, wherein the top contact is associated with a particular shape, and wherein the particular shape is a toothed shape with a particular quantity of teeth. The VCSEL may include at least one implanted region. The VCSEL may include at least one top contact segment.

25 Claims, 4 Drawing Sheets

(56) References Cited

U.S. PATENT DOCUMENTS

2017/0201066 A1* 7/2017 Chen .......................... H01S 5/34
2017/0244219 A1* 8/2017 Barve ...................... H01S 5/423
2021/0075193 A1* 3/2021 Lee ..................... H01S 5/18338

OTHER PUBLICATIONS

Trumpf, "Datacom VCSELs & photodiodes", https://www.trumpf.com/en_US/products/vcsel-solutions-photodiodes/datacom-vcsels-photodiodes/, Jun. 25, 2019, 6 pages.
Mohd Sharizal Alias, "Figure 1", https://www.researchgate.net/figure/Schematic-cross-section-not-to-scale-of-the-fabricated-980-nm-VCSEL-through-CC-EE_fig1_258261150, May 11, 2016, 6 pages.
Finisar Corporation, "Technology", https://www.myvcsel.com/technology, Feb. 3, 2019, 5 pages.

* cited by examiner

FIG. 1

Tooth

VERTICAL CAVITY SURFACE EMITTING LASER MODE CONTROL

RELATED APPLICATION(S)

This application claims priority to U.S. Provisional Patent Application No. 62/835,787, filed on Apr. 18, 2019, and entitled "METHOD FOR VERTICAL CAVITY SURFACE EMITTING LASER (VCSEL) MODE CONTROL AND OPTICAL PROPERTIES MANIPULATION," the content of which is incorporated by reference herein in its entirety.

TECHNICAL FIELD

The present disclosure relates to lasers and to a mode control for a vertical cavity surface emitting laser using a toothed top contact, a shaped implanted region, and/or a set of top contact segments to cause a particular set of modes of emission of the vertical cavity surface emitting laser.

BACKGROUND

Vertical cavity surface emitting lasers (VCSELs) may be used individually and/or in VCSEL arrays for imaging systems, manufacturing systems, communications systems, and/or the like. For example, in a three-dimensional (3D) sensing application, VCSELs provide beams that may be used for facial recognition, gesture recognition, and/or the like. VCSELs may be included in smart phone devices, gaming devices, sensing devices, and/or the like. VCSELs may be used for generating structured light (e.g., in flood illuminators), time of flight (TOF) measurement beams, and/or the like to enable 3D sensing applications.

A VCSEL array may include multiple VCSELs arranged in a particular configuration. For example, a VCSEL array may be arranged with a square grid of VCSELs, a radial grid of VCSELs, a hexagonal grid of VCSELs, a variable spacing grid of VCSELs, a random grid of VCSELs, and/or the like. A particular beam profile may be obtained for a collective output of the VCSEL array (e.g., multiple beams that, at a distance greater than the Rayleigh distance, collectively form a beam) via selection of a corresponding VCSEL array configuration.

Parameters of a VCSEL may affect an emission pattern (e.g., a near field emission pattern or a far field emission pattern) of the VCSEL, which may affect operations of a system that includes the VCSEL and/or operations of a VCSEL array that includes the VCSEL. For example, changes to an oxidation aperture of a VCSEL may be used to confine optical field distribution in an in-plane direction or a radial direction. Furthermore, configuration of the oxidation aperture may enable limitation of carrier flow to a relatively small region of the VCSEL, which may improve current injection for the VCSEL relative to other oxidation aperture configurations.

The emission pattern is formed, for a VCSEL, based on a distribution of electromagnetic energy inside a body of the VCSEL. A perturbation of a carrier distribution may alter an electromagnetic energy distribution, a photon distribution, and/or the like of the VCSEL, which may result in a change to an emission pattern. Such a perturbation may occur as a result of design of the VCSEL to achieve an intended emission pattern.

SUMMARY

According to some implementations, a vertical cavity surface emitting laser (VCSEL) may include a top contact, wherein the top contact is associated with a particular shape, and wherein the particular shape is a toothed shape with a particular quantity of teeth.

In some implementations, a VCSEL may include a top contact and at least one implanted region disposed under at least a portion of the top contact, wherein the at least one implanted region is associated with an implanted region configuration, and wherein the implanted region configuration is a particular quantity or pattern of implantations in a region at least partially under the top contact.

In some implementations, the VCSEL may include a plurality of top contact segments, wherein the plurality of top contact segments is associated with a top contact segment configuration, wherein the top contact segment configuration is a particular quantity or pattern of top contact segments.

In some implementations, a VCSEL may include one or more components configured to emit a patterned optical emission, wherein the patterned optical emission results from at least one of a shaped top contact region, an implanted region, or a segmented top contact region.

In some implementations, an optical system may include a VCSEL configured to emit a patterned optical emission, wherein the patterned optical emission results from at least one of a shaped top contact region, an implanted region, or a segmented top contact region.

DETAILED DESCRIPTION

The following detailed description of example implementations refers to the accompanying drawings. The same reference numbers in different drawings may identify the same or similar elements.

As described above, a distribution of electromagnetic energy within a cavity of a vertical cavity surface emitting laser (VCSEL) may cause a particular emission pattern for emissions of the VCSEL. A VCSEL may include an oxidation aperture that may confine an optical field distribution in an in-plane or a radial direction and may limit carrier flow to a relatively small (e.g., less than a threshold) region of the VCSEL to optimize current injection. By adjusting the cavity structure, the oxidation aperture, and/or the like, a particular pattern of emission modes may be achieved for output of the VCSEL.

A perturbation to a distribution of electromagnetic energy in the cavity of the VCSEL may cause a change to the emission pattern for the VCSEL. For example, a VCSEL may include a metallic contact on a surface of the VCSEL, which forms an ohmic contact to a surface of a semiconductor of the VCSEL. However, as a density of VCSELs within a VCSEL array increases, an amount of available separation between VCSELs of the VCSEL array is reduced. As a result, a pitch between an oxidation aperture and a metallic contact of a VCSEL may be reduced to, for example, less than 5 microns. This may cause inefficiencies in carrier injection and reduce an amount of isolation of each VCSEL relative to each other VCSEL, which may cause increased perturbations to the distribution of electromagnetic energy. As a result of the metallic contact being disposed increasingly close to the oxidation aperture, increased perturbations may affect the carrier and a photon distribution inside a cavity of a VCSEL, resulting in effects to emission patterns.

Some aspects described herein provide a VCSEL with a configuration of a top contact, a set of implanted regions, and/or a set of top contact segments to control a current path of the VCSEL. For example, the VCSEL may include a tooth-shaped top contact, a set of implanted regions, and/or a set of top contact segments. In this way, a current path of the VCSEL is selected to control emission modes for emissions of the VCSEL. Moreover, the configuration of the VCSEL may complement an effect of the oxidation aperture by controlling a photon energy distribution of emissions of the VCSEL. In this way, an emission pattern is controlled, thereby improving a system that includes the VCSEL, such as an imaging system, a manufacturing system, a communications system, and/or the like.

Figure 1:
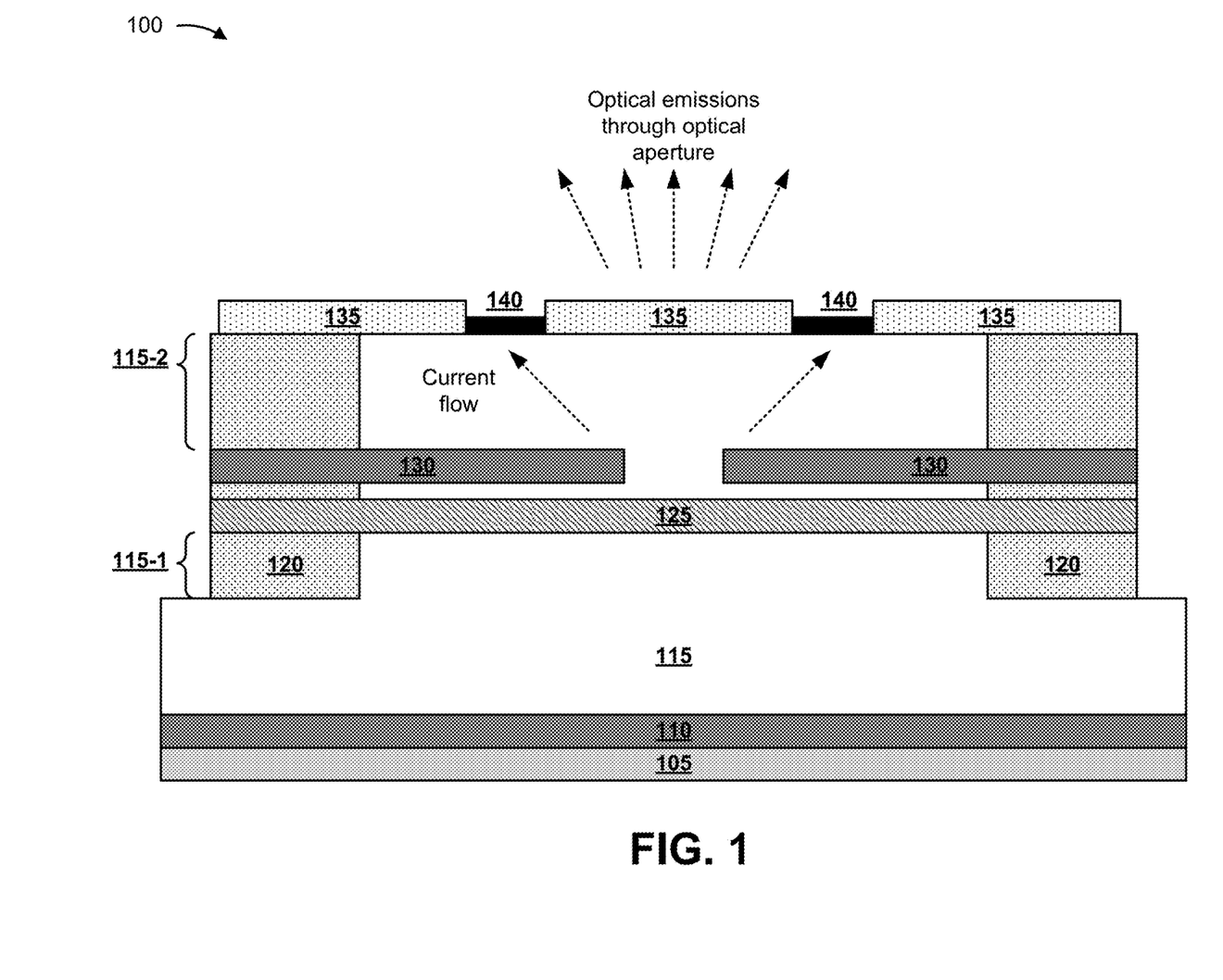
FIG. 1 is a diagram of an example cross-section of a VCSEL, as described herein.

FIG. 1 is a diagram of an example VCSEL 100 described herein. As shown in FIG. 1, example VCSEL 100 may include a cathode 105, a substrate 110, a mirror 115, which may include a bottom mirror 115-1 and a top mirror 115-2, an ion implant region 120, an active layer 125, an oxide aperture 130, a dielectric layer 135, a p-ohmic metal region 140, and/or the like.

As further shown in FIG. 1, current may flow from approximately the cathode 105, through oxidation aperture 130 and toward p-ohmic metal region 140, and optical emissions may be directed outward from an optical aperture approximately aligned with oxidation aperture 130.

In some implementations, p-ohmic metal region 140 may form a top contact that may cover at least a portion of a top surface of VCSEL 100, all of the top surface of VCSEL 100, and/or the like. For example, p-ohmic metal region 140 may form a toothed-arrangement, as described herein in more detail with regard to FIGS. 2A-2D, a segmented arrangement, as described in more detail with regard to FIGS. 4A-4D, and/or the like. In some implementations, p-ohmic metal region 140 includes a conductive surface deposited and/or formed on a top surface of VCSEL 100. For example, p-ohmic metal region 140 may form a tooth shape with a particular quantity of teeth, such as 2 teeth, 3 teeth, 4 teeth, 5 teeth, 6 teeth, and/or the like. In some implementations, an inner edge of p-ohmic metal region 140 is tooth-shaped and an outer edge of p-ohmic metal region 140 is ring-shaped. In some implementations, p-ohmic metal region 140 may have a particular tooth shape for each tooth. For example, p-ohmic metal region 140 may have a squared toothed shape, a triangular toothed shape, a rectangular toothed shape, a circular toothed shape, a combination thereof (e.g., a tooth with rectilinear sides and a rounded edge), and/or the like. In some implementations, p-ohmic metal region 140 may include a plurality of different types of tooth shapes, such as a first tooth with a square toothed shape and a second tooth with a triangular toothed shape, to achieve a particular emission mode.

In some implementations, p-ohmic metal region 140 may form a ring, which is larger than oxidation aperture 130, to avoid blocking emissions from within VCSEL 100.

Although described herein in terms of a top contact formed by a p-ohmic metal region 140 formed using a p-ohmic material, the top contact may be an n-ohmic metal region formed using an n-ohmic material. In this case, current may travel downward from an n-ohmic metal region on a top surface through the oxide aperture (130) of VCSEL 100. As described above for a p-metal contact, an n-metal contact may include teeth which may change a current path relative to a prior art ring-shaped top contact, thereby controlling emission modes of VCSEL 100.

By using a tooth-shaped inner edge for a top contact (e.g., formed by p-ohmic metal region 140), VCSEL 100 may constrain a current path relative to having a ring-shaped inner edge. Based on constraining the current path, VCSEL 100 may provide emission modes with a particular emission mode configuration, such as a mode with N-fold (e.g., 5-fold) radial symmetry for N teeth (e.g., 5 teeth).

In some implementations, ion implant region 120 may form an implanted region that may surround at least a portion of the VCSEL structure and/or cover a portion of a top surface of VCSEL 100. In some implementations, ion implant region 120 may be disposed under a section of p-ohmic metal region 140 to restrict current flow. For example, VCSEL 100 may include a set of ion implanted regions 120 on and under a surface of VCSEL 100. In this way, VCSEL 100 may use one or more of the toothed-arrangement, the segmented arrangement, the implanted regions, and/or the like to control the current flow.

Ion implant region 120 includes a patterned implantation that surrounds at least a portion of the VCSEL structure and/or covers a portion of a top surface of VCSEL 100. For example, ion implanted region 120 may be formed on VCSEL 100 to limit carrier flow to a particular region of VCSEL 100, and may be configured to cause an optical emission with a particular pattern. In some implementations, ion implanted region 120 may include an ion implantation that may inhibit current flow in ion implanted region 120. For example, ion implanted region 120 may be a current blocker that may increase resistance relative to a non-implanted region. In this case, a difference in a resistance of ion implanted region 120 relative to another portion of a VCSEL 100, may be on an order of greater than approximately 100:1. In other words, a conductance of ion implanted region 120 may be less than $1/100$ of that of mirror regions 115 and active area 125. Additional details regarding ion implanted region 120 are described with regard to FIGS. 3A-3D.

As indicated above, FIG. 1 is provided merely as an example. Other examples may differ from what is described with regard to FIG. 1.

FIGS. 2A-2D are diagrams of example implementations 200-230 described herein.

Figure 2A:
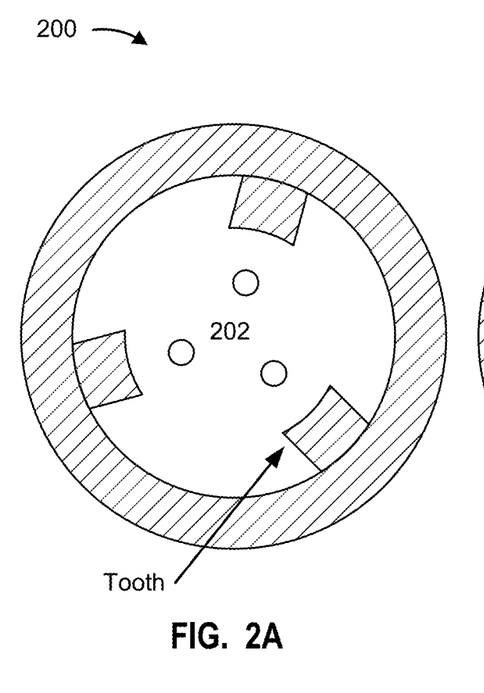
FIGS. 2A-2D are diagrams of example implementations of top contact configurations to control emission modes of a VCSEL, as described herein.

As shown in FIG. 2A, and by example implementation 200, a first configuration of a top contact (e.g., formed by a p-ohmic metal region 140) may include a set of three teeth evenly distributed around a VCSEL. As shown by reference number 202, the set of three teeth cause a set of three emission modes with 3-fold radial symmetry. For example, based on causing current flow to/from the three teeth, the top contact may cause three emission modes to be formed for an output of the VCSEL.

Figure 2B:
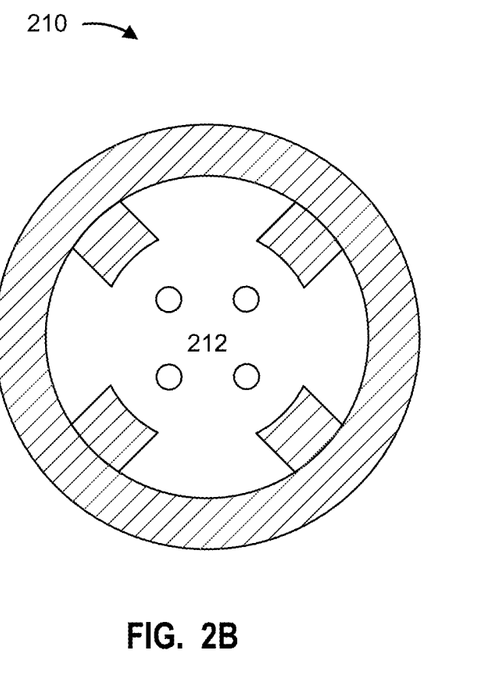
Figure 2C:
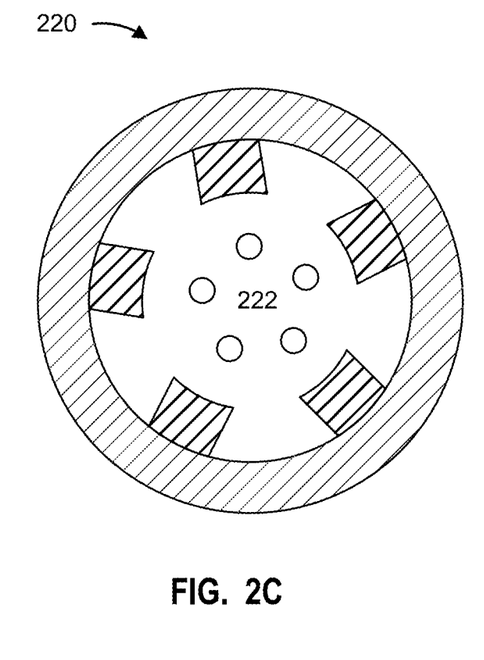
Figure 2D:
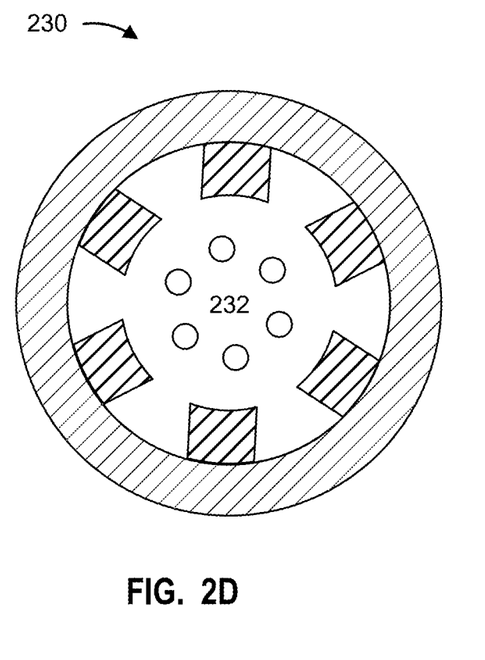

As shown in FIG. 2B, and by example implementation 210, a second configuration of a top contact may include a set of 4 teeth evenly distributed around a VCSEL. As shown by reference number 212, the set of 4 teeth cause a set of 4 emission modes with 4-fold radial symmetry. As shown in FIG. 2C, and by example implementation 220, a third configuration of a top contact may include a set of 5 teeth evenly distributed around a VCSEL. As shown by reference number 222, the set of 5 teeth cause a set of 5 emission modes with 5-fold radial symmetry. As shown in FIG. 2D, and by example implementation 230, a fourth configuration of a top contact may include a set of 6 teeth evenly distributed around a VCSEL. As shown by reference number 232, the set of 6 teeth cause a set of 6 emission modes with 6-fold radial symmetry.

In some implementations, a pattern of teeth of a top contact of a VCSEL may be symmetric (e.g., evenly distributed around the VCSEL). For example, as shown in FIGS. 2A-2D, teeth may be evenly distributed around a body of the VCSEL. Additionally, or alternatively, teeth may be irregularly arranged to form irregularly arranged modes. Additionally, or alternatively, teeth may be heterogeneous. For example, a first tooth of a top contact may be associated with a first shape, size, and/or position, and a second tooth of the top contact may be associated with a second shape, size, and/or position. In this way, the VCSEL may, for example, suppress higher order modes, cause a differential in energy of each mode, and/or the like. Based on controlling the emission modes, the VCSEL may enable generation of a particular near-field emission pattern, a particular far-field emission pattern, and/or the like.

As indicated above, FIGS. 2A-2D are provided merely as one or more examples. Other examples may differ from what is described with regard to FIGS. 2A-2D.

FIGS. 3A-3D are diagrams of example implementations 300-320 described herein.

Figure 3A:
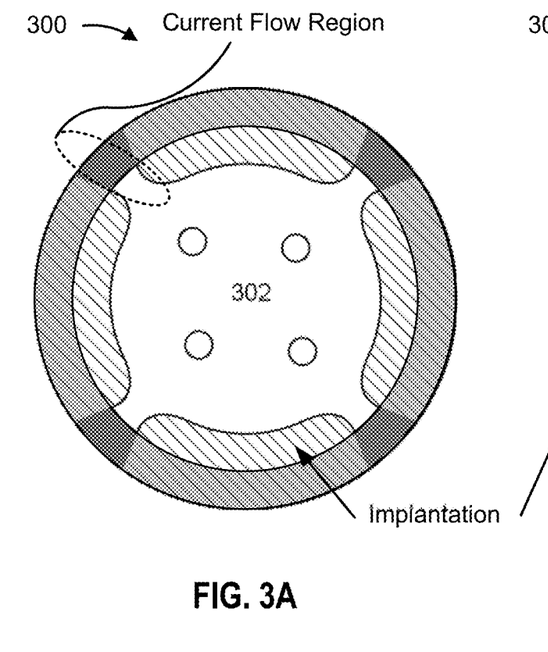
FIGS. 3A-3D are diagrams of example implementations of implanted region configurations to control emission modes of a VCSEL, as described herein.
Figure 3B:
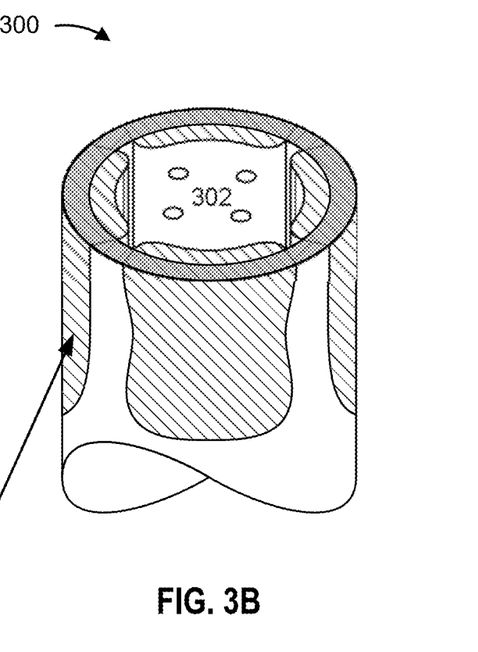

As shown in FIGS. 3A and 3B, and by example implementation 300, a first configuration of an implanted region (e.g., formed by ion implant region 120) may include a set of 4 implantations evenly distributed around a VCSEL. As shown by reference number 302, the set of 4 implantations cause a set of 4 emission modes with 4-fold radial symmetry. As a result of an increased level of resistance associated with the set of 4 implantations, current flow may be directed toward areas of a top contact not covered by the implantations, resulting in emissions modes of a VCSEL aligned to a current flow region. As shown by example implementation 300, the set of 4 implantations may extend from a top surface of the VCSEL and partially surround the VCSEL. Although some implementations are described in terms of a particular symmetry of implantations (e.g., evenly distributed implanted regions to cause radial symmetry), non-symmetric and/or other irregular shaped and arranged implantations are possible.

Figure 3C:
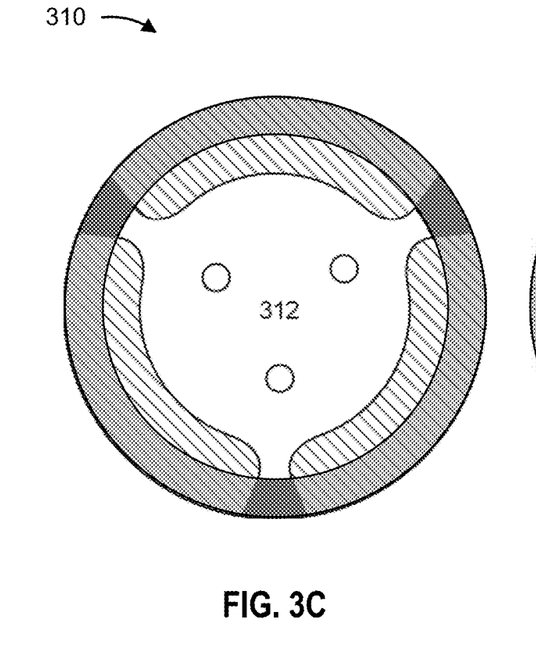
Figure 3D:
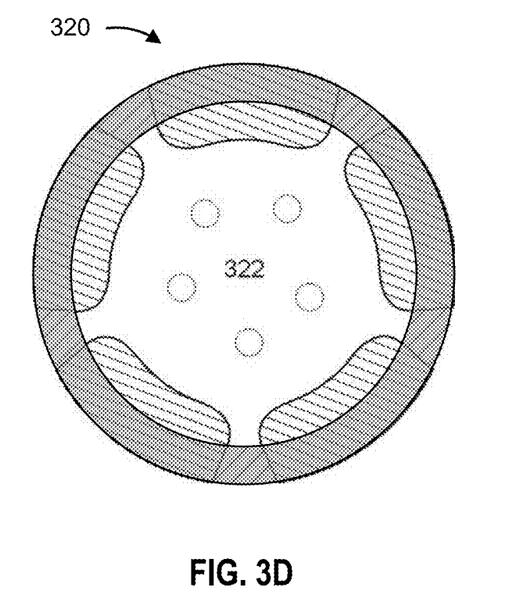

As shown in FIG. 3C, and by example implementation 310, a second configuration of an implanted region may include a set of three implantations evenly distributed around a VCSEL. As shown by reference number 312, the set of three implantations cause a set of three emission modes with 3-fold rotational symmetry. As shown in FIG. 3D, and by example implementation 320, a third configuration of an implanted region may include a set of 5 implantations evenly distributed around a VCSEL. As shown by reference number 322, the set of 5 implantations cause a set of 5 emission modes with 5-fold radial symmetry.

As indicated above, FIGS. 3A-3D are provided merely as one or more examples. Other examples may differ from what is described with regard to FIGS. 3A-3D.

FIGS. 4A-4D are diagrams of example implementations 400-430 described herein.

Figure 4A:
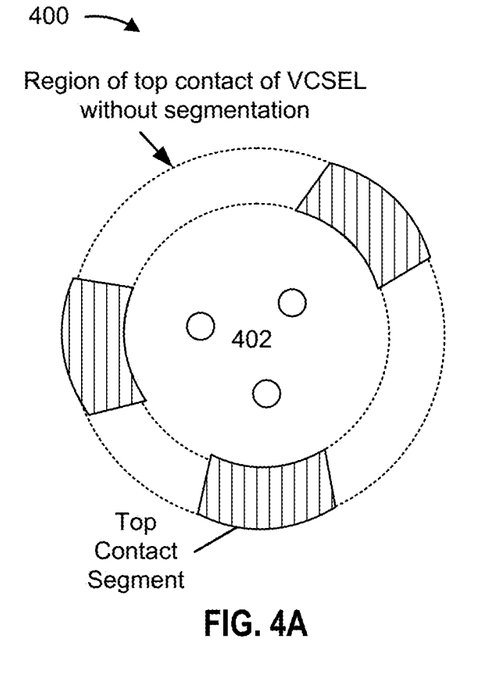
FIGS. 4A-4D are diagrams of example implementations of top contact segment configurations to control emission modes of a VCSEL, as described herein.

As shown in FIG. 4A, and by example implementation 400, a first configuration of a VCSEL may include a set of three top contact segments (e.g., formed by p-ohmic metal region 140) evenly distributed around a top surface of a VCSEL. As shown by reference number 402, the set of three top contact segments cause a set of three emission modes with 3-fold radial symmetry. In some implementations, the set of top contact segments may have a particular shape. For example, a top contact segment may have a rectangular shape, an arc shape (as shown), and/or the like. Although some implementations are described in terms of symmetric (e.g., evenly distributed) top contact segments, non-symmetric and/or other irregular shaped and arranged top contact segments are possible.

Figure 4B:
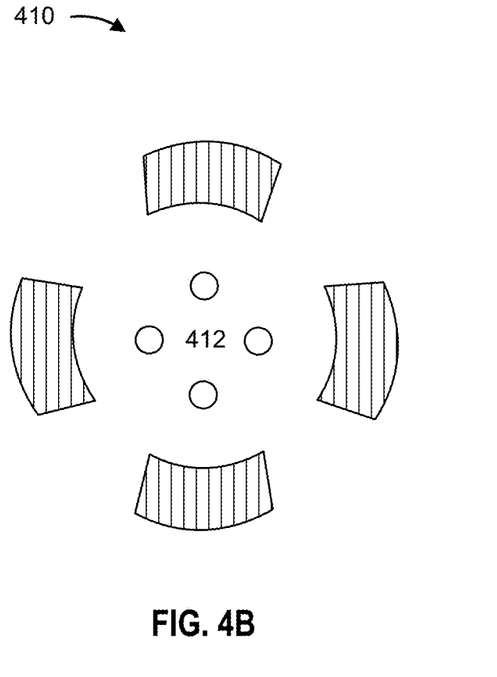
Figure 4C:
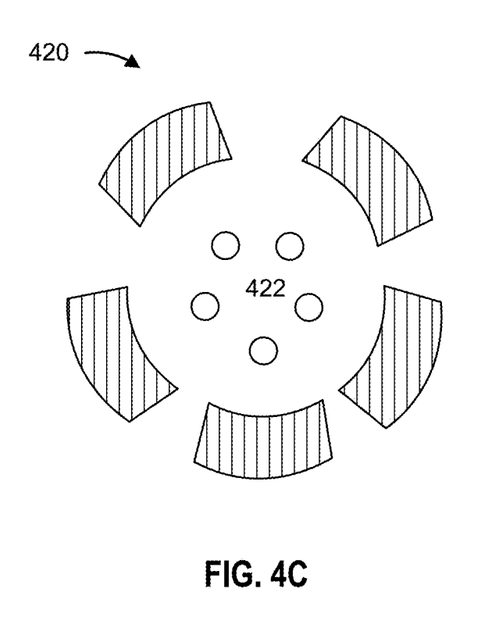
Figure 4D:
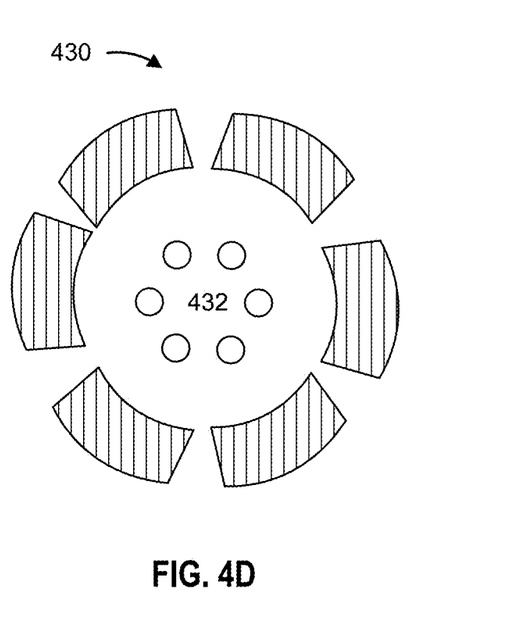

As shown in FIG. 4B, and by example implementation 410, a second configuration of a VCSEL may include a set of 4 top contact segments evenly distributed around a top surface of a VCSEL. As shown by reference number 412, the set of 4 top contact segments cause a set of 4 emission modes with 4-fold radial symmetry. As shown in FIG. 4C, and by example implementation 420, a third configuration of a VCSEL may include a set of 5 top contact segments evenly distributed around a top surface of a VCSEL. As shown by reference number 422, the set of 5 top contact segments cause a set of 5 emission modes with 5-fold radial symmetry. As shown in FIG. 4D, and by example implementation 430, a fourth configuration of a VCSEL may include a set of 6 top contact segments evenly distributed around a top surface of a VCSEL. As shown by reference number 432, the set of 6 top contact segments cause a set of 6 emission modes with 6-fold radial symmetry.

As indicated above, FIGS. 4A-4D are provided merely as one or more examples. Other examples may differ from what is described with regard to FIGS. 4A-4D.

The foregoing disclosure provides illustration and description, but is not intended to be exhaustive or to limit the implementations to the precise forms disclosed. Modifications and variations may be made in light of the above disclosure or may be acquired from practice of the implementations.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A vertical cavity surface emitting laser (VCSEL), comprising:
a top contact,
wherein the top contact is associated with a particular shape, and
wherein the particular shape is a toothed shape with a plurality of differently shaped teeth.

2. The VCSEL of claim 1, further comprising:
at least one implanted region disposed under at least a portion of the top contact.

3. The VCSEL of claim 1, wherein at least a portion of the top contact is segmented to form a set of top contact segments.

4. The VCSEL of claim 1, wherein the particular shape of the top contact is configured to cause a particular emission mode configuration for emissions of the VCSEL.

5. The VCSEL of claim 1, wherein the top contact is a p-ohmic top contact or an n-ohmic top contact.

6. The VCSEL of claim 1, wherein the toothed shape is at least one of a square toothed shape, a rectangular toothed shape, or a triangular toothed shape.

7. The VCSEL of claim 1, wherein the top contact is larger than an oxidation aperture of the VCSEL.

8. The VCSEL of claim 1, wherein the top contact includes a particular symmetry associated with a particular quantity of the plurality of differently shaped teeth, and
wherein the particular symmetry and the particular quantity is, respectively, one of:
3-fold radial symmetry with 3 teeth,
4-fold radial symmetry with 4 teeth,
5-fold radial symmetry with 5 teeth, or
6-fold radial symmetry with 6 teeth.

9. A vertical cavity surface emitting laser (VCSEL) comprising:
a top contact; and
a plurality of implanted regions disposed under a portion of the top contact,
wherein the plurality of implanted regions extend through a top surface of the VCSEL and partially surround the VCSEL,
wherein the plurality of implanted regions control an emission mode of the VCSEL.
wherein the plurality of implanted regions form a circular shape defining gaps between respective implant regions of the plurality of implanted regions, and
wherein the plurality of implanted regions are associated with an implanted region configuration.

10. The VCSEL of claim 9, wherein the top contact is segmented to form a plurality of top contact segments.

11. The VCSEL of claim 9, wherein the implanted region configuration is configured to cause a particular emission mode configuration for emissions of the VCSEL.

12. The VCSEL of claim 9, wherein the plurality of implanted regions restrict a flow of current to or from the top contact.

13. The VCSEL of claim 9, wherein a first conductance of the plurality of implanted regions is less than a second conductance of a mirror region of the VCSEL.

14. The VCSEL of claim 13, wherein the first conductance is less than $1/100$ of the second conductance.

15. The VCSEL of claim 9, wherein the plurality of implanted regions includes:
3 implantations,
4 implantations,
5 implantations, or
6 implantations.

16. The VCSEL of claim 9, wherein the emission mode is associated with N-fold symmetry.

17. The VCSEL of claim 9, wherein the top contact is associated with a toothed shape.

18. A vertical cavity surface emitting laser (VCSEL), comprising:
a plurality of top contact segments,
wherein the plurality of top contact segments is associated with a top contact segment configuration,
wherein the top contact segment configuration is a particular quantity or pattern of top contact segments, and
wherein the plurality of top contact segments include tooth-shaped segments with differently shaped teeth.

19. The VCSEL of claim 9, wherein the plurality of implanted regions comprise differently sized implanted regions.

20. The VCSEL of claim 18, wherein the top contact segment configuration is configured to cause a particular emission mode configuration for emissions of the VCSEL.

21. The VCSEL of claim 18, further comprising at least one implantation region disposed at least partially under a surface of at least one top contact segment, of the plurality of top contact segments, to restrict a current flow in the at least one top contact segment.

22. A vertical cavity surface emitting laser (VCSEL), comprising:
one or more components configured to:
emit a patterned optical emission,
wherein the patterned optical emission results from at least one of:
a top contact region having a toothed shape that comprises a plurality of differently shaped teeth, or
a plurality of implanted regions, disposed under a portion of a top contact of the VCSEL, forming a circular shape defining gaps between respective implant regions of the plurality of implanted regions,
wherein the plurality of implanted regions extend through a top surface of the VCSEL and partially surround the VCSEL, and
wherein the plurality of implanted regions control an emission mode of the VCSEL.

23. The VCSEL of claim 22, wherein the plurality of implanted regions comprise differently sized implanted region.

24. An optical system, comprising:
a vertical cavity surface emitting laser (VCSEL) configured to emit a patterned optical emission,
wherein the patterned optical emission results from at least one of:
a top contact region having a toothed shape that comprises a plurality of differently shaped teeth, or
a plurality of implanted regions, disposed under a portion of a top contact of the VCSEL, forming a circular shape defining gaps between respective implant regions of the plurality of implanted regions,
  wherein the plurality of implanted regions extend through a top surface of the VCSEL and partially surround the VCSEL, and
  wherein the plurality of implanted regions control an emission mode of the VCSEL.

25. The optical system of claim 24, wherein the plurality of implanted regions comprise differently sized implanted regions.

\* \* \* \* \*